(12) United States Patent
Yoo et al.

(10) Patent No.: US 8,081,098 B2
(45) Date of Patent: Dec. 20, 2011

(54) INTEGRATOR, DELTA-SIGMA MODULATOR, ANALOG-TO-DIGITAL CONVERTER AND APPLICATIONS THEREOF

(75) Inventors: KwiSung Yoo, Suwon-si (KR); MinHo Kwon, Seoul (KR); DongHun Lee, Yongin-si (KR); Wunki Jung, Suwon-si (KR); SeogHeon Ham, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,869

(22) Filed: Jan. 7, 2010

(65) Prior Publication Data

US 2010/0177213 A1     Jul. 15, 2010

(30) Foreign Application Priority Data

Jan. 13, 2009  (KR) .................. 10-2009-0002496

(51) Int. Cl.
*H03M 3/00*  (2006.01)

(52) U.S. Cl. ..................... 341/143; 341/155; 341/172

(58) Field of Classification Search .................. 341/143, 341/155, 172, 119
See application file for complete search history.

(56) References Cited

U.S. PATENT DOCUMENTS

| | | | |
|---|---|---|---|
| 6,061,009 A | 5/2000 | Krone | |
| 6,847,319 B1* | 1/2005 | Stockstad | 341/119 |
| 6,970,126 B1* | 11/2005 | O'Dowd et al. | 341/172 |
| 2002/0041247 A1* | 4/2002 | Steensgaard-Madsen | 341/156 |
| 2005/0093726 A1* | 5/2005 | Hezar et al. | 341/143 |
| 2007/0013566 A1* | 1/2007 | Chuang | 341/143 |
| 2008/0068484 A1* | 3/2008 | Nam | 348/333.01 |

FOREIGN PATENT DOCUMENTS

JP      06-303143      10/1994

* cited by examiner

*Primary Examiner* — Jean Jeanglaude
(74) *Attorney, Agent, or Firm* — Harness, Dickey & Pierce (57) ABSTRACT

In one embodiment, the modulator in an analog-to-digital converter includes a first reset switch and second reset switch, each controlled by a reset signal. The first reset switch is connected in a first reset feedback path between an input and an output of an integrator stage, and the second reset switch connected in a second reset feedback path between the input and the output of the integrator stage.

27 Claims, 10 Drawing Sheets

INTEGRATOR, DELTA-SIGMA MODULATOR, ANALOG-TO-DIGITAL CONVERTER AND APPLICATIONS THEREOF

PRIORITY STATEMENT

This application claims the benefit of priority under 35 U.S.C. §119 to Korean Patent Application No. 2009-0002496, filed on Jan. 13, 2009, in the Korean Intellectual Property Office, the entire contents of which is incorporated herein by reference.

BACKGROUND

1. Field

The present invention relates to the field of analog-to-digital conversion.

2. Description of the Related Art

The general technique of providing analog-to-digital (A/D) or digital-to-analog (D/A) conversion of signals is well known in the art. Generally, the sampling rate that is required to sample an analog signal for A/D conversion must be twice the highest frequency component being sampled. This rate is known as the Nyquist rate. More recently, oversampling methods have been utilized for A/D and D/A conversion. In an oversampling type of convertor, the sampling rate is much higher than the Nyquist rate.

An advantage of using the oversampling technique is in the precision provided by the converter. With converters operating under the Nyquist rate for sampling, a certain amount of precision is required for the conversion. For example, in converting an analog signal into a 16-bit digital format, 16-bit precision is required. Accordingly, circuits will need to be designed having components which will meet this precision. In many instances, closely trimmed circuit components or precision matching (or compensating) circuits are required to meet the precision.

However, when sampling at a rate much higher than the required Nyquist sampling rate, the oversampling technique permits circuit precision to be relaxed significantly. For example, an A/D oversampling converter implements an oversampling modulator, the modulator output can be a single bit output. The circuit precision needs only to meet this 1-bit output. Accordingly, closely trimmed circuit components are generally not needed. Additionally, 1-bit precision can be readily met by current generating CMOS (complementary-metal-oxide-semiconductor) components.

The disadvantage of using the oversampling technique is the added requirement that the output generally needs to be reduced at the eventual output of the converter. That is, the higher sampling rate is usually returned to the Nyquist rate. In the above example, a multiple number of the 1-bit outputs will need to be combined to form a single output (e.g., 16-bit, 32-bit, etc.). However, the oversampling technique is preferred in many applications, since the cost savings in using less precise circuit components outweigh the additional digital signal processing needed at the back end of the converter.

One well-known type of oversampling A/D conversion uses a modulator commonly referred to as a delta-sigma modulator. Delta-sigma modulation is a method for encoding high-resolution signals into lower-resolution signals using pulse-density modulation. In an A/D converter (ADC) using a delta-sigma modulator, an integrator and a comparator are utilized at the front end of the converter to provide the quantization of the analog signal. Then, a low-pass filter and a decimator are utilized for digital signal processing to provide a corresponding digital signal at the Nyquist rate. However, the circuit precision of the analog circuitry can be relaxed, due to the use of the higher sampling rate.

When delta-gamma modulators are utilized, the modulator can be designed for higher than the first order of operation. Higher order operation of a delta-sigma modulator is desirable, since lower sampling rates can be utilized to obtain the same precision as operating the modulator at a lower order but with higher sampling rates. However, at higher order operation, stability is a concern. That is, the non-linear response of the delta-sigma comparator in the feedback path causes an unstable behavior.

It is noted that the instability condition is different than an overload condition. In an overload condition, the modulator experiences a degraded signal-to-noise ratio when the input amplitude exceeds a certain value, but the modulator can recover when the overload condition is removed. Instability is also a function of the amplitude of the input signal, but in this instance (unlike the overload condition), the modulator cannot recover from an unstable behavior with the reduction of the input signal. In order to return the system to its proper operating behavior, the state variables of the modulator can be reset to values within a stable state space. Resetting the values to a zero condition will generally suffice.

SUMMARY

The present invention relates to analog-to-digital conversion.

Associated with this, the present invention also related to a modulator in an analog-to-digital converter.

In one embodiment, the modulator in an analog-to-digital converter includes a first reset switch and second reset switch, each controlled by a reset signal. The first reset switch is connected in a first reset feedback path between an input and an output of an integrator stage, and the second reset switch connected in a second reset feedback path between the input and the output of the integrator stage.

The modulator may include first and second capacitors connected in series to the integrator stage. A first node is between the first and second capacitors, and a second node is between the second capacitor and the integrator stage.

The modulator may further include a first switch controlled by a first clock signal and connected between the first node and a reference voltage. A third reset switch, controlled by the reset signal, may be connected between the first node and the reference voltage.

Still further, the modulator may further include a second switch, controlled by a second clock signal, connected between the first capacitor and the reference voltage.

In the above embodiment, the first and second clock signals may have non-overlapping pulses.

In one embodiment, the modulator further includes a third switch controlled by the second clock signal. The third switch is connected between the first node and a third node. An inverse reset switch, controlled by an inverse of the reset signal, is connected between the first node and the third switch, and the first reset switch is connected between the third node and the output of the integrator stage.

The integrator stage may include an inverter or an operational amplifier.

Another embodiment of a modulator includes at least first and second integrator stages connected in series. At least one of the first and second integrator stages includes a first reset switch and a second reset switch controlled by a reset signal. The first reset switch is connected in a first reset feedback path between an input and an output of an integrator stage, and the second reset switch is connected in a second reset feedback path between the input and the output of the integrator stage. A summer is configured to sum output from the first and second integrator stages, and a comparator is configured compare output of the summer and a reference signal to generate an output.

Another embodiment of a modulator includes at least first and second integrator stages connected in series. At least one of the first and second integrator stages includes a first reset switch and a second reset switch controlled by a reset signal. The first reset switch is connected in a first reset feedback path between an input and an output of an integrator stage, and the second reset switch is connected in a second reset feedback path between the input and the output of the integrator stage. A comparator is configured compare output of a last integrator stage and a reference signal to generate an output.

An analog-to-digital converter according to an embodiment may include a modulator according to any of the above-described embodiments.

The present invention also relates to an image sensor.

In one embodiment, the image sensor a pixel unit array, a row decoder configured to selectively enabling output of a row of pixel units in the pixel unit array, and a processing circuit configured to process output from each pixel unit in the enabled row of pixel units. The processing circuit may include an analog-to-digital converter according to any of the above-described embodiments, and/or may include a modulator according to any of the above-described embodiments.

The present invention still further relates to an image processing system.

In one embodiment, the image processing system includes an image sensor according to one of the above described embodiments, an analog-to-digital converter according to any of the above-described embodiments, and/or may include a modulator according to any of the above-described embodiments.

The present invention also relates to method of integration, modulation, analog-to-digital conversion, image sensing and/or image processing.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
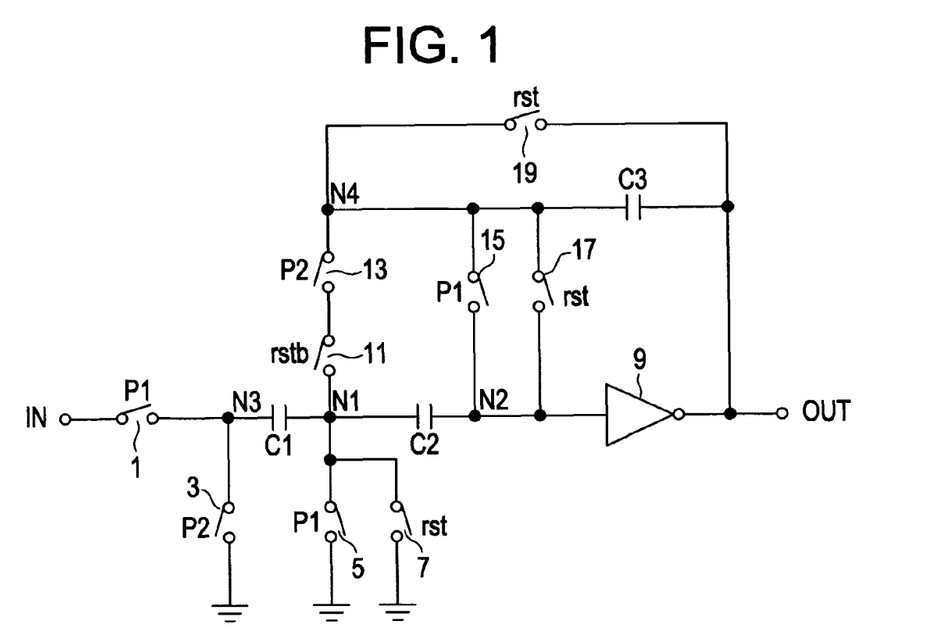
FIG. 1 illustrates an integrator for a delta-sigma analog-to-digital converter (ADC) according to an embodiment.

FIG. 1 illustrates an integrator for a delta-sigma analog-to-digital converter (ADC) according to an embodiment. As shown, the integrator is a switched capacitor integrator that includes an inverter 9. First and second capacitors C1 and C2 are connected in series to the input of the inverter 9. The node between the first and second capacitors C1 and C2 will be referred to as a first node N1, and the node between the second capacitor C2 and the input of the inverter 9 will be referred to as the second node N2. An input signal IN is supplied to the first capacitor C1 via a first switch 1. The first switch 1 is controlled by a first clock signal P1, and the node between the first switch 1 and the first capacitor C1 will be referred to as the third node N3. A second switch 3 is connected between the third node N3 and ground. The second switch 3 is controlled by a second clock signal P2.

A third switch 5 is connected between the first node N1 and ground, and a fourth switch 7 is also connected between the first node N1 and ground. The third switch 5 is controlled by the first clock signal P1, and the fourth switch 7 is controlled by a reset signal.

As further shown in FIG. 1, a third capacitor C3 is connected between the output of the inverter 9 and a fourth node N4. A fifth switch 19 is also connected between the output of the inverter 9 and the fourth node N4. The fifth switch 19 is controlled by the reset signal. A sixth switch 11 and a seventh switch 13 are connected in series between the first node N1 and the fourth node N4. The sixth switch 11 is controlled by an inverse of the reset signal, and the seventh switch 13 is controlled by the second clock signal P2. An eighth switch 15 is connected between the fourth node N4 and the second node N2, and a ninth switch 17 is connected between the fourth node N4 and the second node N2. The eighth switch 15 is controlled by the first clock signal P1, and the ninth switch 17 is controlled by the reset signal.

Figure 2A:
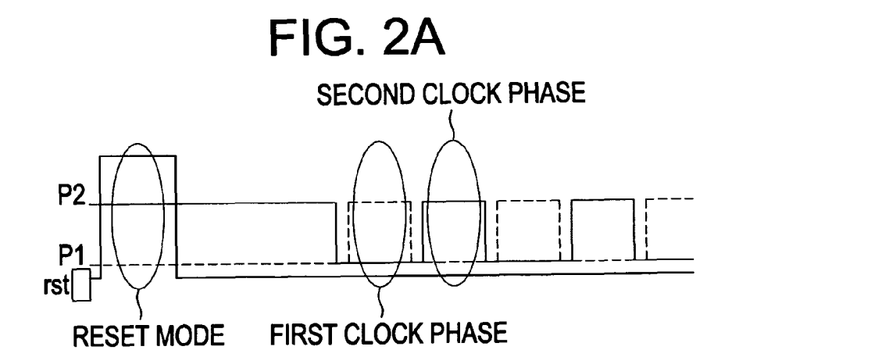
FIGS. 2A and 2B illustrate the first and second clock signals P1 and P2 as well as the reset signal rst for different phase modes.
Figure 2B:
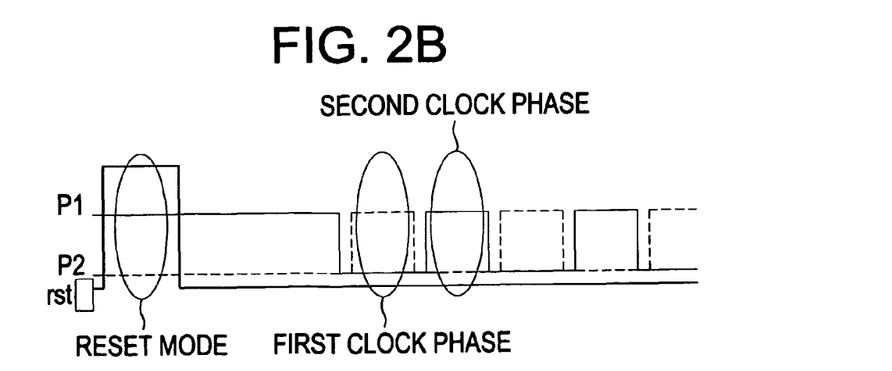

Next, operation of the integrator illustrated in FIG. 1 will be described with respect to FIGS. 2A-2B. FIGS. 2A and 2B illustrate the first and second clock signals P1 and P2 as well as the reset signal rst for different phase modes. In particular, FIG. 2A illustrates the case where the reset signal is asserted while the first clock signal P1 is logic low and second clock signal P2 is logic high. FIG. 2B illustrates the situation where the reset signal rst is asserted when the first clock signal P1 is logic high and the second clock signal P2 is logic low. As shown in both FIGS. 2A and 2B, the first and second clock signals P1 and P2 have non-overlapping pulses. As such, the switches controlled by these respective clock signals are not closed at the same time. For the purposes of discussion only, it is assumed that a switch is closed in response to the logic high state of the controlling signal. A clock generator (not shown) may generate the first and second clock signals P1 and P2. The clock generator may be external to the integrator, internal or external to a delta-sigma modulator including the integrator, internal or external to an analog-to-digital converter including the integrator, etc. The reset signal may be supplied by a detection unit such as described with respect to FIGS. 12 and 14-16 below.

First, normal non-reset, operation will be described. This operation is the same with respect to both FIGS. 2A and 2B as both have a first clock phase and a second clock phase. During the first clock phase, the first clock signal P1 is logic high and the second clock signal P2 is logic low. During the first clock phase, a sampling operation on the input signal IN is carried out. In particular, the first switch 1 is closed and the second switch 3 is open such that the input signal is supplied to the first capacitor C1. Furthermore, the third switch 5 is closed, connecting the first node N1 to ground. The eighth switch 15 is closed connecting the third capacitor C3 between the input and output of the inverter 9. Still further, the fourth, fifth, seventh and ninth switches 7, 19, 13 and 17 remain open. As a result, the input signal is sampled or stored in the first capacitor C1. Accordingly, the first clock phase may also be referred to as the sampling phase of the integrator.

During the second clock phase, the first clock signal P1 is logic low and the second clock signal P2 is logic high. The first switch 1 opens preventing the supply of the input signal IN to the first capacitor C1, and the second switch 3 closes connecting the third node N3 to ground.

The third and fourth switches 5 and 7 are also open such that the first node N1 is not connected to ground. Instead, the sixth and seventh switches 11 and 13 are closed such that the first node N1 is connected to the fourth node N4. This results in the third capacitor C3 being connected between the first node N1 and the output of the inverter 9. Furthermore, the second node N2 is disconnected from the fourth node N4 with the eighth and ninth switches 15 and 17 being open. The fifth switch 19 is also open.

With the third capacitor C3 connected between the first node N1 and the output of the inverter 9, an integrator (or amplifier) is formed to integrate the input signal sampled in the first capacitor C1 using the first through third capacitors C1-C3. As will be appreciated, the second clock phase may also be called the integration phase.

Returning to FIGS. 2A and 2B, it will be seen that the integrator alternates between the sampling and integration phases to generate an integration output at the inverter 9. Next, the reset mode will be described with respect to the different phase modes of FIGS. 2A and 2B.

In the phase mode of FIG. 2A, the reset signal rst is asserted while the second clock signal P2 is logic high and the first clock signal P1 is logic low. Accordingly, the first node N1 is connected to ground by the fourth switch 7 and the third node N3 is connected to ground by the third switch 3. As a result, the first and third nodes are reset to a stable state. In this instance, a zero condition.

Still further, even though the sixth switch 11 and the eighth switch 15 are open, the output of the inverter 9 is directly connected with the second node N2 (i.e., the input of the inverter 9) via the fifth switch 19 and the ninth switch 17. This allows the input and output of the inverter 19 to also reach a stable state.

During the reset mode of the phase mode illustrated in FIG. 2B, the first clock signal P1 is logic high, the second clock signal P2 is logic low, and the reset signal rst is logic high. Referring to FIG. 1, the first node N1 is connected to ground by the third and fourth switches 5 and 7; thus stabilizing this node. Further, the output of the inverter 9 is directly connected to the input of the inverter via the fifth switch 19 and the eighth and ninth switches 15 and 17. Thus, the input and output of the inverter 9 are also stabilized.

As will be appreciated, the fourth switch 7 permits stabilizing the first node N1 during the phase mode of FIG. 2A. Absent this switch, the first node N1 would not be stabilized. Similarly, the addition of the ninth switch 17 and the sixth switch 11 allows for the input and out of the inverter 9 to become stabilized during the phase mode of FIG. 2A. Absent these switches, the input and output of the inverter 9 would not be stabilized. With respect to the phase mode of FIG. 2B stabilization is achieved without the fourth, ninth and sixth switches 7, 17 and 11.

As will be appreciated, addition of the ninth switch 17 creates more that one reset feedback path. Namely, as discussed above one reset feedback path from the output of inverter 9 includes the fifth switch 19 and the eighth 15. However, addition of the ninth switch 17 includes another reset feedback path that includes the fifth switch 19 and the ninth switch 17.

As will be appreciated, the inverter 9 in the above-described embodiment may be replaced with an operational amplifier.

Figure 3:
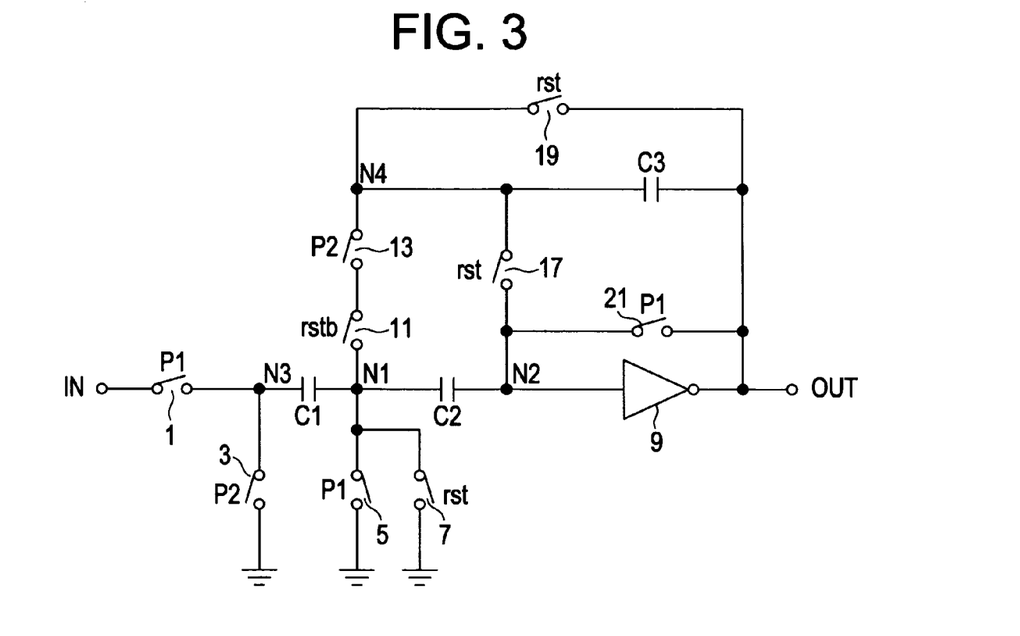
FIG. 3-11 illustrates integrators according to other embodiments.

FIG. 3 illustrates an integrator according to another embodiment. This embodiment is the same as the embodiment of FIG. 1 except that the eighth switch 15 has been eliminated and a tenth switch 21 has been added. Accordingly, for the purposes of brevity, only these differences and their impact on operation will be described in detail.

The tenth switch 21 is connected between the output of the inverter 9 and the second node N2, and is controlled by the first clock signal P1. In this embodiment the integration and sampling phases operate in the same manner as described with respect to FIG. 1 except that during the sampling phase, the third capacitor C3 is not connected between the input and output of the inverter 9.

Figure 4:
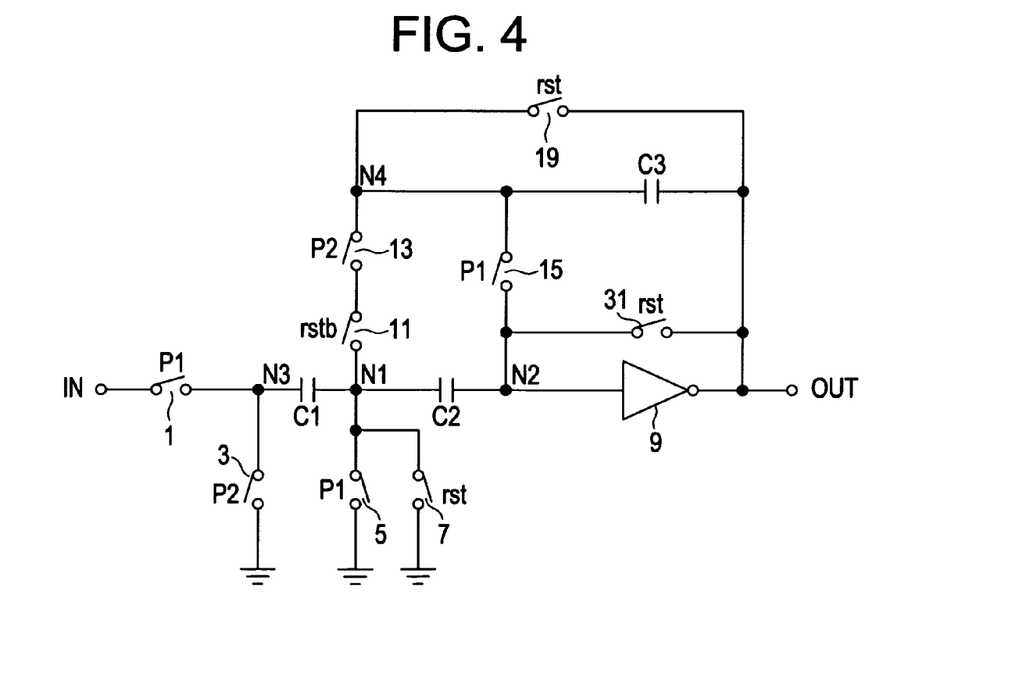

FIG. 4 illustrates another embodiment of the integrator. This embodiment is the same as FIG. 1 except that the ninth switch 17 has been eliminated and an eleventh switch 31 has been added. For the sake of brevity, only these differences will be discussed in detail.

The eleventh switch 31 is connected between the input and output of an inverter 9, and is controlled by the reset signal. Accordingly; the embodiment FIG. 4 operates in the same manner as the embodiment of FIG. 1 with respect to the sampling and integration phases. However, during a reset operation, the eleventh switch 31 connects the input and output of the inverter 9 to stabilize the inverter. Therefore, as will be appreciated, the fifth switch 19 may be eliminated in this embodiment and other similarly situated embodiments.

Figure 5:
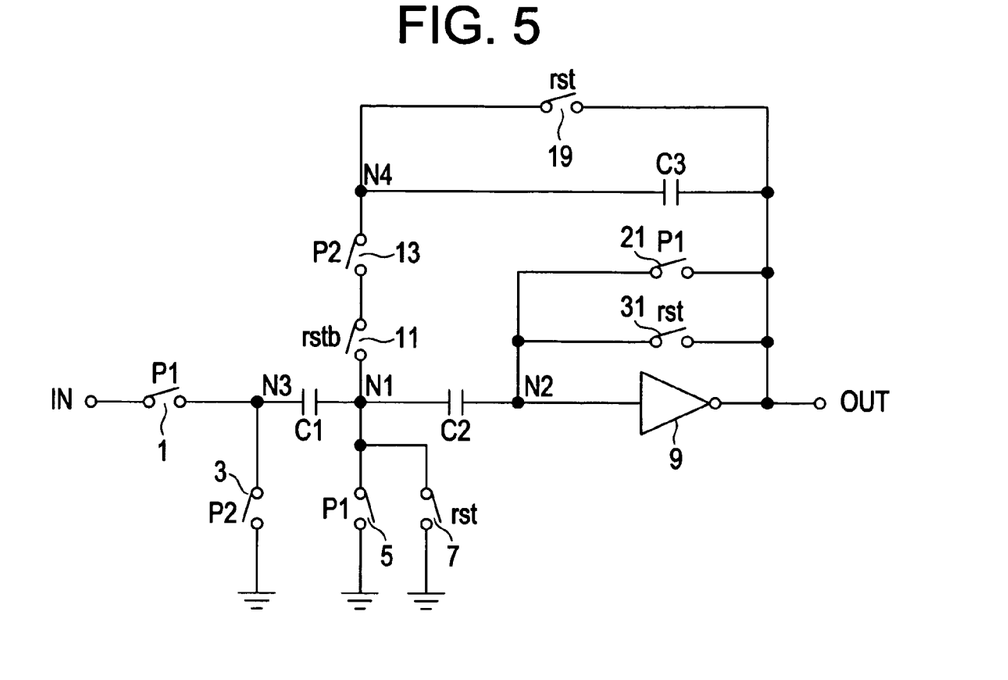

FIG. 5 illustrates a still further embodiment of the integrator or integration device. The embodiment of FIG. 5 is just the same as the embodiment of FIG. 1 except that the eighth and ninth switches 15 and 17 have been eliminated, and the tenth and eleventh switches 21 and 31 have been added as in the previously described embodiments. Accordingly, for the sake of brevity, only these differences will be described in detail.

As shown, both the tenth and eleventh switches 21 and 31 are connected between the input and output of the inverter 9. The tenth switch 21 is controlled by the first clock signal P1, and the eleventh switch 31 is controlled by the reset signal. As with the embodiment of FIG. 3, the embodiment of FIG. 5 does not connect the capacitor C3 between the input and output inverter 9 during the sampling phase. Furthermore, during the reset operation, in either phase, the eleventh switch 31 connects the input/output of the inverter 9.

Figure 6:
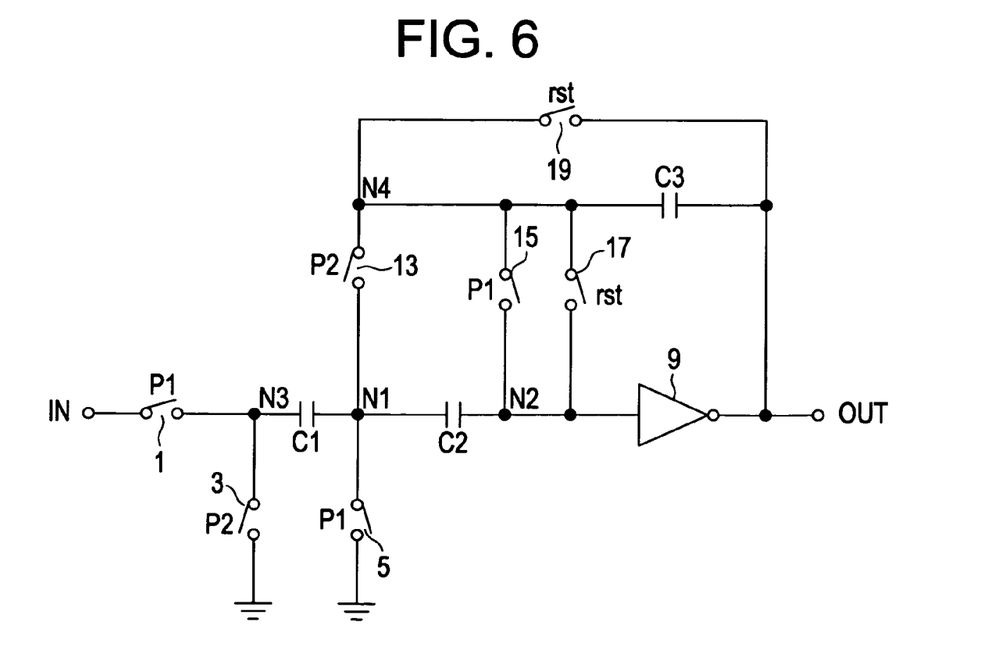

FIG. 6 illustrates yet another embodiment of the integrator. The embodiment of FIG. 6 is the same as the embodiment of FIG. 1 except that the fourth and sixth switches 7 and 11 have been eliminated. For the sake of brevity, only these differences will be described in detail.

With the sixth switch 11 eliminated, the seventh switch 13 is connected to the first node N1. As a result, for a reset operation during the integration phase, the first node N1 becomes connected with both the input and output of the inverter 9. Still further, with the elimination of the fourth switch 7, the first node N1 is not grounded during the reset operation of the integration phase. Accordingly, in this embodiment, output of the reset signal may be restricted to the sampling phase.

Figure 7:
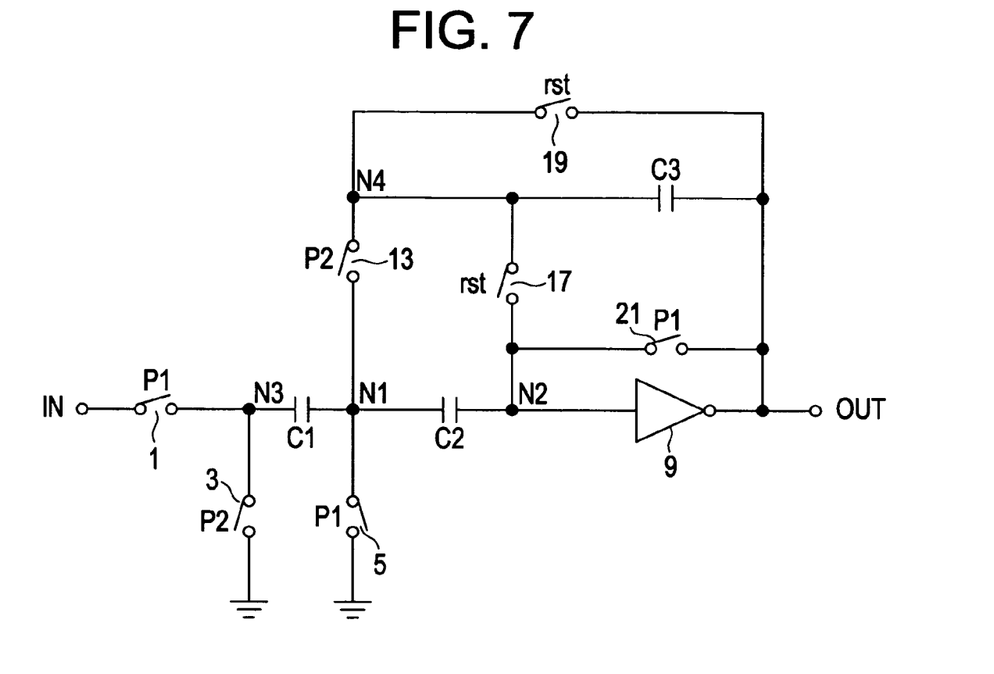
Figure 8:
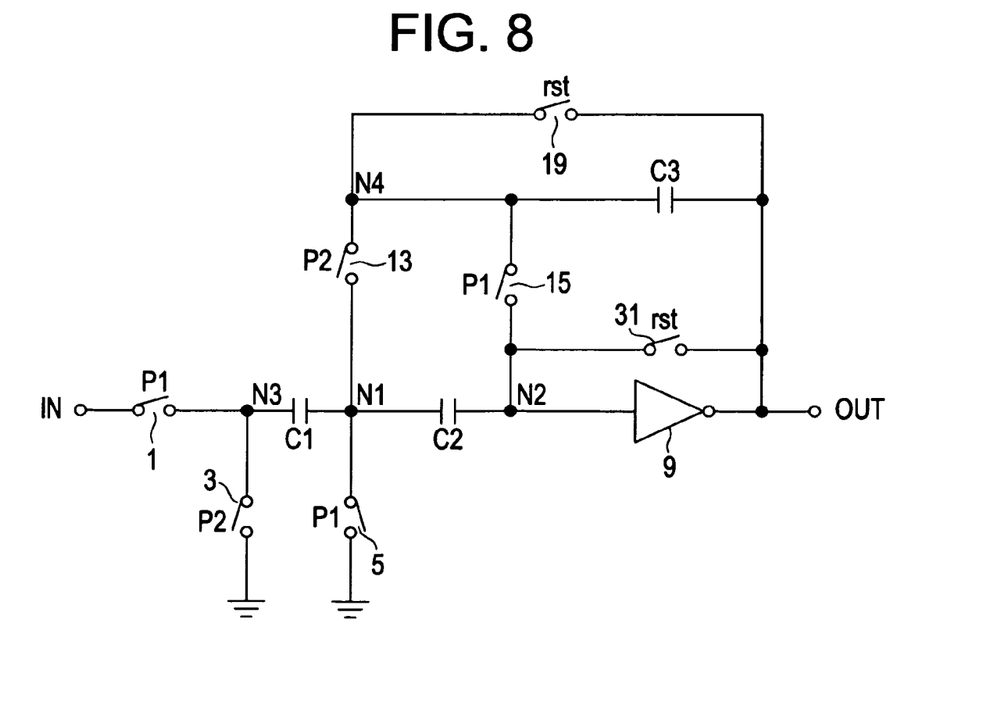
Figure 9:
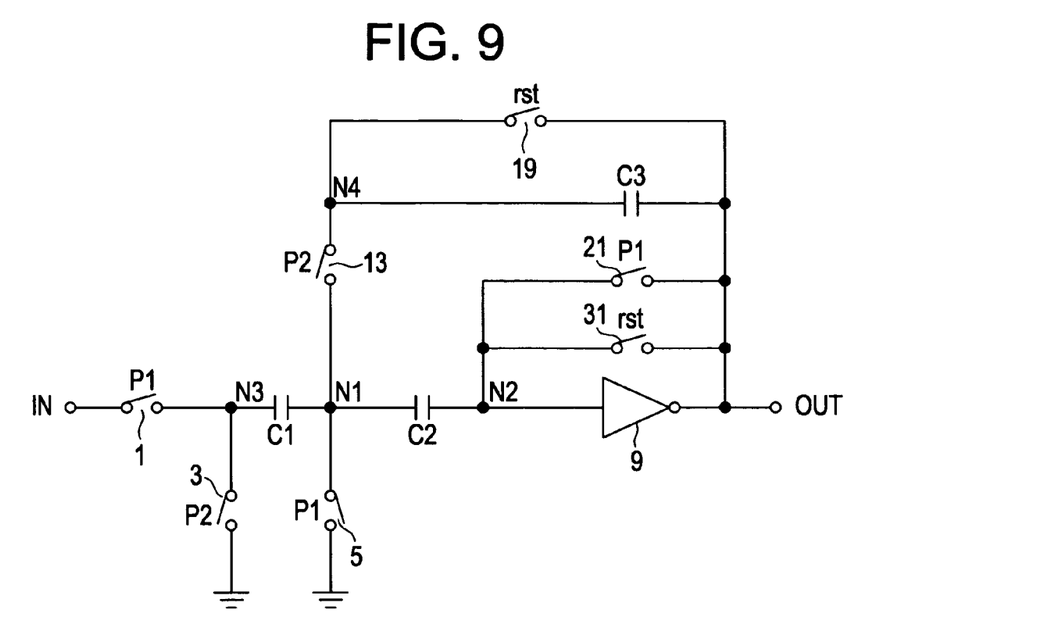

FIGS. 7, 8 and 9 illustrate additional embodiments of the integrator. The embodiments of FIGS. 7, 8 and 9 are the same as the embodiments of FIGS. 3, 4 and 5, respectively except that the fourth switch 7 and the sixth switch 11 have been eliminated in the same manner as described above with respect to FIG. 6. In view of the above, the structure and operation of these embodiments will be readily understood.

Figure 10:
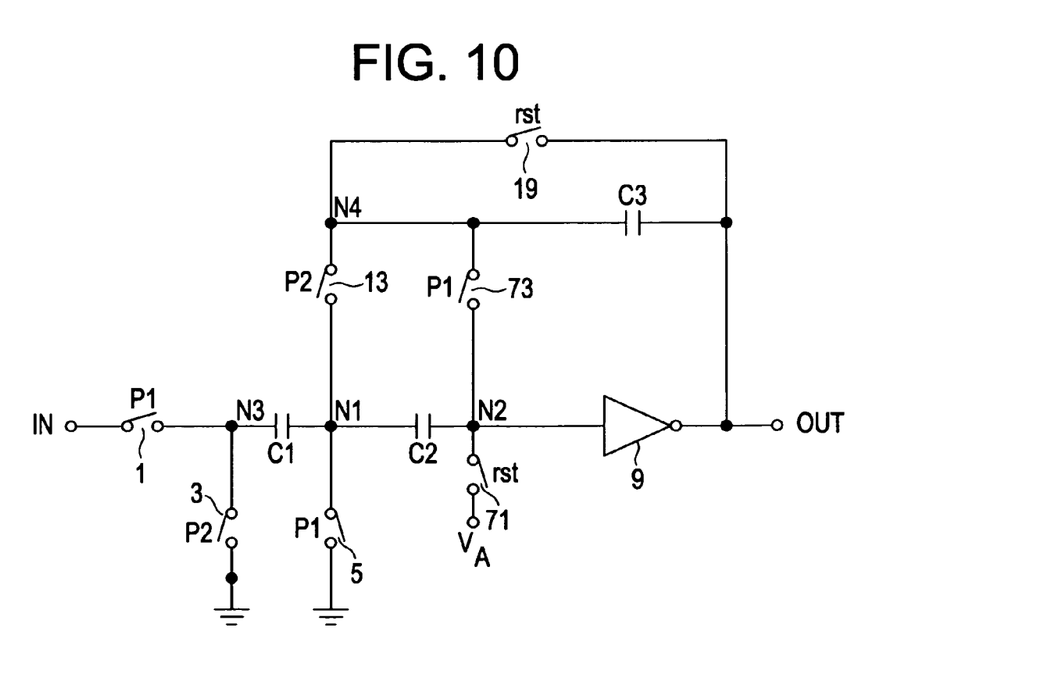

FIG. 10 illustrates another embodiment of the integrator. The embodiment of FIG. 10 is the same as the embodiment of FIG. 6 except that the ninth switch 17 has been eliminated, and a twelfth switch 71 has been added. Accordingly, for the sake of brevity, only these differences will be described in detail. The twelfth switch 71 is connected to the second node N2 (i.e., to the input of the inverter 9), and supplies a voltage Va. The twelfth switch 71 is controlled by the reset signal. During a reset operation of either the sampling or integration phases, the twelfth switch closes to supply the voltage Va to the second node. Thus, this operation stabilizes the second node N2 and the inverter 9. In one embodiment, the voltage Va may be ground.

Figure 11:
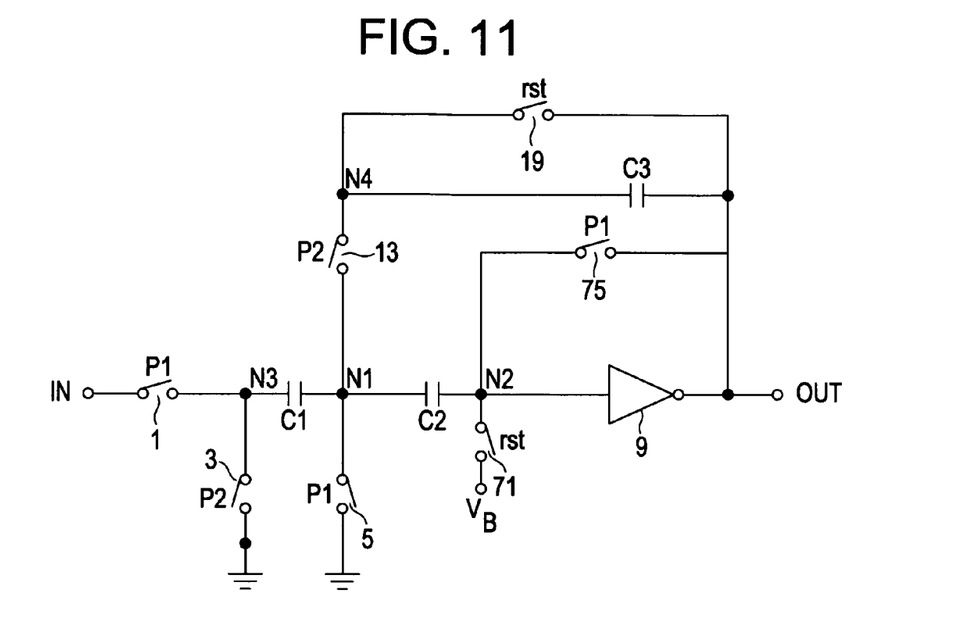

FIG. 11 illustrates a further embodiment of the integrator. The embodiment of FIG. 11 is the same as the embodiment of FIG. 9 except the eleventh switch 31 has been eliminated and the twelfth switch 71 has been added. For the sake of brevity, only these differences will be described in detail. As with the embodiment of FIG. 10, the embodiment of FIG. 11 the twelfth switch 71 is connected to the second node N2, and supplies the voltage Va based on the reset signal. Accordingly, the operation of FIG. 11 would be readily understood from the previous description of the embodiment of FIG. 10.

As will be appreciated, with respect to any of the above described embodiments, the inverter 9 may be replaced with an operational amplifier.

Figure 12:
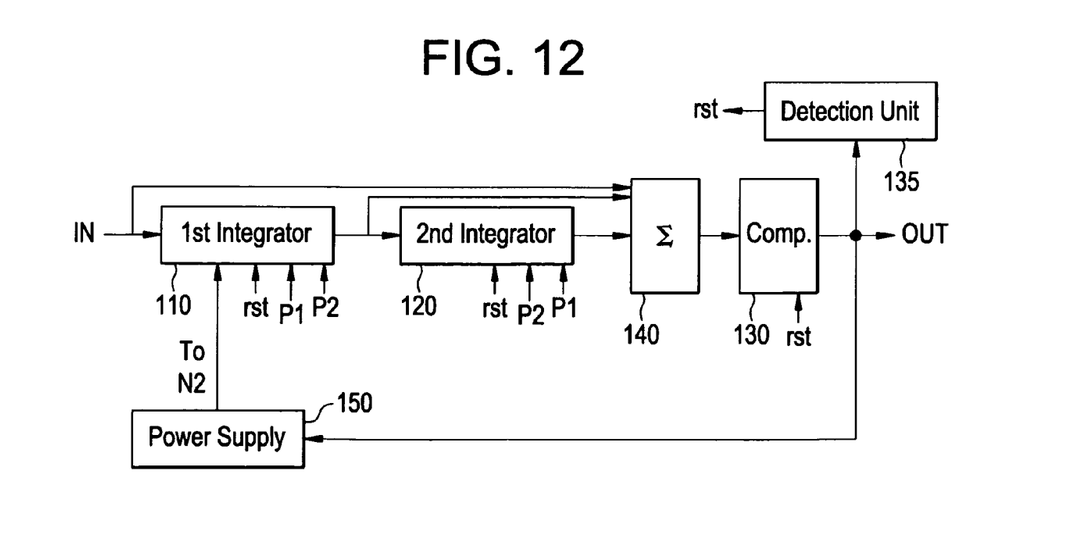
FIG. 12 illustrates a second order delta-sigma modulator according to an embodiment.

FIG. 12 illustrates a second order delta-sigma modulator according to an embodiment. Because this delta-sigma modulator is a second order delta-sigma modulator, the delta-sigma modulator includes a first integrator 110 and a second integrator 120. The first integrator 110 receives the input signal IN and performs the integration operations thereon. For example, the first integrator 110 may be any of the above described integrator embodiments. As such, the first integrator also receives the first clock signal P1, the second clock signal P2 and the reset signal. Output of the first integrator is supplied as input to the second integrator 120. The second integrator 120 may be any of the above described embodiments as well. However, those embodiments are modified such that (i) those switches described as receiving the first clock signal P1 instead receive the second clock signal P2, and (ii) those switches described as receiving the second clock signal P2 instead receive the first clock signal P1. As such, the second integrator 120 performs the sampling operation during the second clock phase, and performs the amplifying/or integration operation during the first clock phase. As will be appreciated, this is the opposite of the operation of the first integrator 110.

Figure 13:
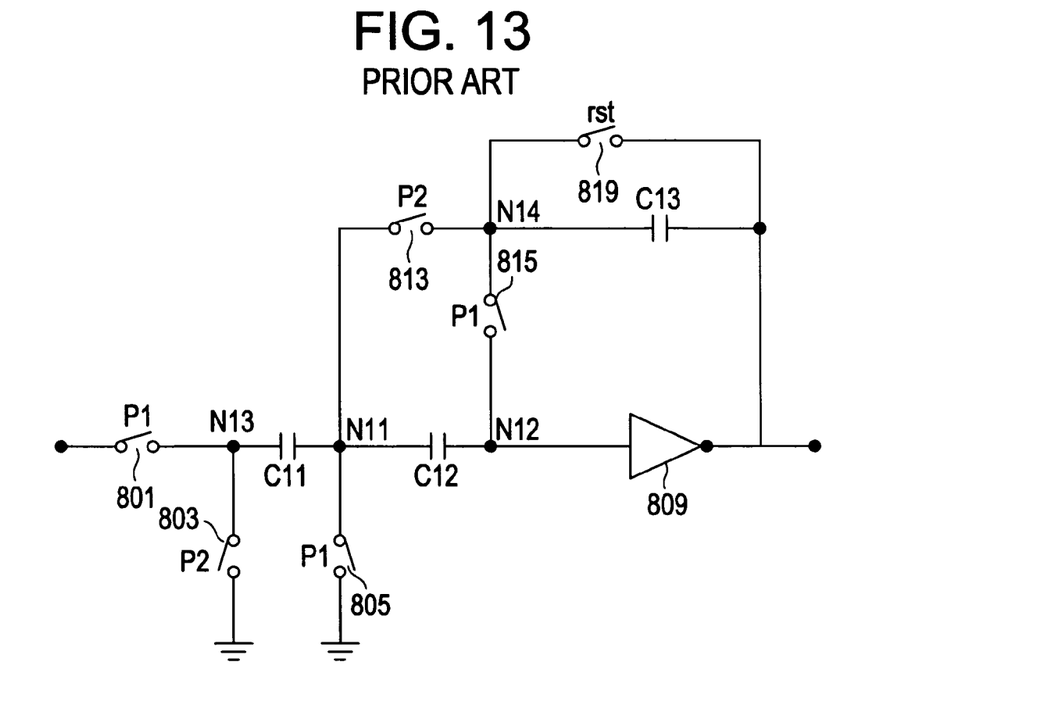
FIG. 13 illustrates a prior art integrator.

Because the second integrator 120 performs the sampling operation during the second clock phase, any well known integrator may be used for the second integrator such as that shown in FIG. 13 without, generally, suffering from such adverse instability issues. The prior art integrator of FIG. 13 will be described in greater detail below.

The input signal IN, the output of the first integrator 110 and the output of the second integrator 120 are summed by a summer 140. A comparator 130 compares the output of the summer 140 to a reference signal to produce an output signal. In one embodiment, the reference signal may be ground. For example the comparator 130 may be a differential amplifier receiving output of the summer 140 at its positive input while the negative input is connected to ground. Still further, the comparator 130 may receive the reset signal to have the input thereof reset to a voltage such as ground during a reset operation. Accordingly, when the output of the summer 140 is greater than or equal to the reference voltage, the comparator 130 outputs a logic high signal, and when the output of the summer 140 is less than the reference voltage, the comparator 130 outputs a logic low signal.

As shown in FIG. 12, the output of the comparator 130 also controls a power supply 150 which supplies either a first voltage V1 or a second voltage V2 to the second node N2 of the first integrator 110. If the comparator 130 outputs a logic high signal, the power supply 150 supplies the first voltage V1, and if the output of the comparator 130 is logic low the power supply 150 outputs a second voltage V2. The first voltage V1 is greater than the second voltage V2.

Furthermore, a detection unit 135 can be coupled to any of the integrator stages, but as implemented herein, the detection input is obtained from the final output from the comparator 130. The detection unit 135 is used to monitor the condition which will cause the modulator to become unstable. When the modulator exhibits an unstable behavior, the detection unit 135 outputs a logic high reset signal to trigger the reset operation. The logic high reset signal is output until the detection unit 135 has determined the instability condition is no longer present.

It will be appreciated that the second order delta-sigma modulator of FIG. 9 has a feed forward structure commonly referred to as a cascade integrator feed forward (see CIFF).

Next, the conventional integrator illustrated in FIG. 13 will described in detail. As shown, the integrator is a switched capacitor integrator that includes an inverter 809. Capacitors C11 and C12 are connected in series to the input of the inverter 809. The node between the capacitors C11 and C12 will be referred to as node N11, and the node between the capacitor C12 and the input of the inverter 809 will be referred to as the node N12. An input signal IN is supplied to the capacitor C11 via a switch 801. The switch 801 is controlled by the first clock signal P1, and the node between the switch 801 and the capacitor C1 will be referred to as the node N13. A switch 803 is connected between the node N3 and ground. The switch 803 is controlled by a second clock signal P2. A switch 805 is connected between the node N11 and ground. The switch 805 is controlled by the first clock signal P1.

As further shown in FIG. 13, a capacitor C13 is connected between the output of the inverter 809 and a node N14. A switch 819 is connected between the node N14 and the output of the inverter 809. The switch 819 is controlled by the reset signal. A switch 813 is connected between the node N11 and the node N14. The switch 813 is controlled by the second clock signal P2. A switch 815 is connected between the node N14 and the node N12. The switch 815 is controlled by the first clock signal P1.

Figure 14:
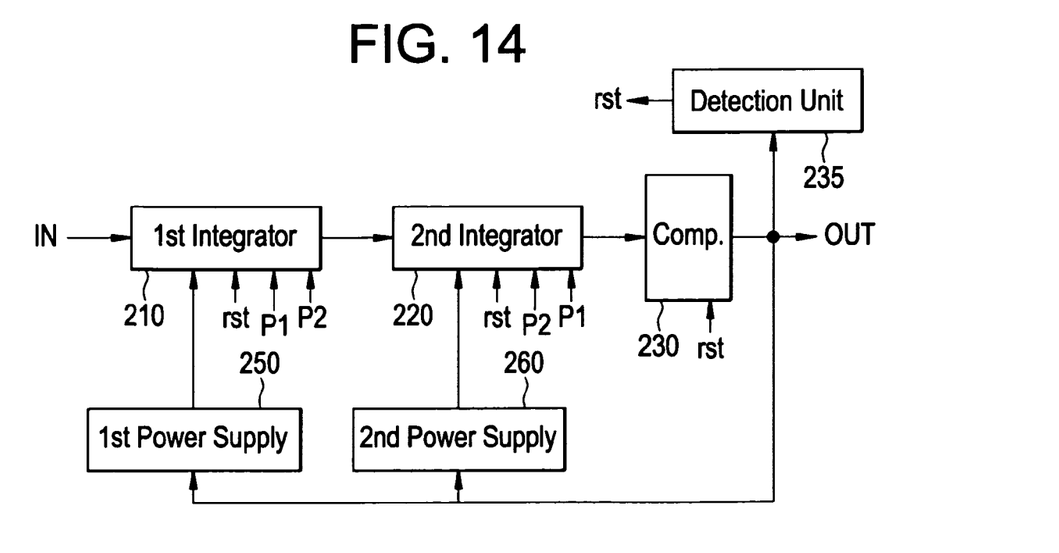
FIG. 14 illustrates a second order delta-sigma modulator according to another embodiment.

FIG. 14 illustrates another embodiment of a second order delta-sigma modulator according to an embodiment. This embodiment will be recognized as having a feedback structure commonly referred to as cascade integrator feedback (see CIFB). In this embodiment a first integrator 210 receives the input signal IN and supplies an output to a second integrator 220. The second integrator 220 supplies output to a comparator 230. The first integrator 210 may be any of the above described embodiments of the present invention. The second integrator 220 may also be any of the above described embodiments of the present invention, or may be a conventional integrator such as illustrated in FIG. 13. As with the second integrator 120 of FIG. 12, the second integrator 220 differs from the above described embodiments in that (i) the switches receiving the first clock signal P1 instead receive the second clock signal P2, and (ii) the switches receiving the second clock signal P2 instead receive the first clock signal P1. As such, the sampling and integration phases of the second integrator 220 are opposite those of the first integrator 210. The comparator 230 is the same as the comparator 130. Namely, the comparator 230 compares the output of the second integrator 220 to a reference voltage and generates an output based on the comparison. For example, the comparator 230 may include a differential amplifier receiving the output of the second integrator 220 at the positive input, and may receive the reference voltage at its negative input. The reference voltage may be ground. The comparator 230 may also receive the reset signal, and reset the positive input to ground based on the reset signal.

As further shown in FIG. 14, first and second power supplies 250 and 260 receive the output of the comparator 230. When the output of the comparator is logic high, the first and second power supplies 250 and 260 supply the first voltage V1 to the second nodes N2 of the first and second integrators 210 and 220, respectively. When the output of the comparator 230 is logic low, the first and second power supplies 250 and 260 supply the second voltage V2 to the second nodes N2 of the first and second integrators 210 and 220, respectively.

Furthermore, a detection unit 235 can be coupled to any of the integrator stages, but as implemented herein, the detection input is obtained from the final output from the comparator 230. The detection unit 235 is used to monitor the condition which will cause the modulator to become unstable. When the modulator exhibits an unstable behavior, the detection unit 235 outputs a logic high reset signal to trigger the reset operation. The logic high reset signal is output until the detection unit 235 has determined the instability condition is no longer present.

Figures 15, 16:
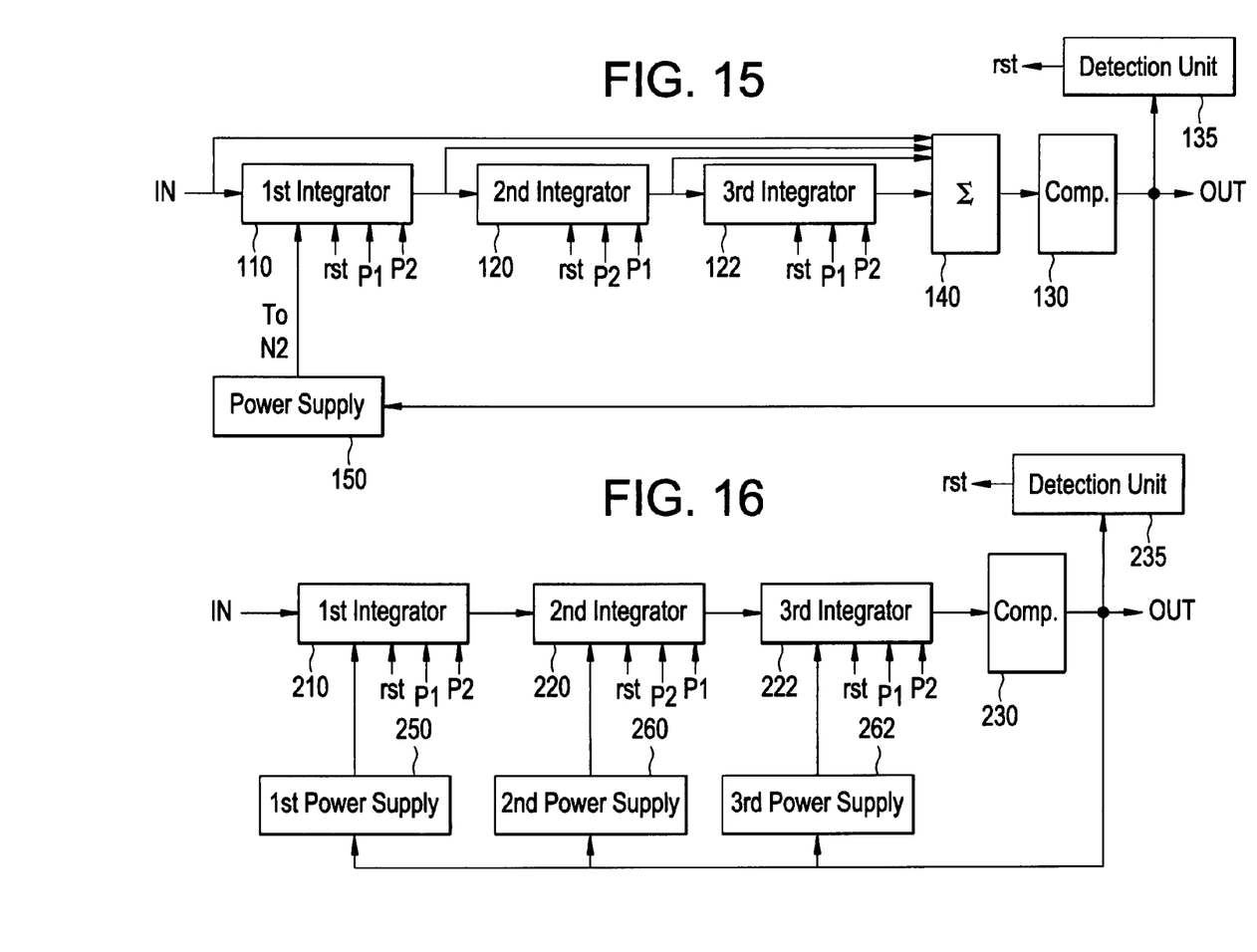
FIG. 15 illustrates a third order delta-sigma modulator according to an embodiment.
FIG. 16 illustrates a third order delta-sigma modulator according to another embodiment.

FIG. 15 illustrates a third order delta-sigma modulator according to an embodiment. This third order delta-sigma modulator is the same as the second order delta-sigma modulator shown in FIG. 12 except that the embodiment of FIG. 15 includes an additional integrator. Accordingly, only the differences between the embodiment of FIG. 15 and that of FIG. 12 will be described for the same of brevity. As shown in FIG. 15, a third integrator 122 receives the output of the second integrator 120, and the output of the third integrator 122 is supplied to the summer 140 along with the output of the second integrator 120, the output of the first integrator 110, and the input signal IN. The third integrator may be the same as the first integrator 110, and/or may be any of the above described embodiments of the present invention. As will be appreciated, the third integrator 122 has the same sampling and integration phases as the first integrator 110.

More generally, for an Nth order integrator, the odd numbered integrators may be any of the above described embodiments of the present invention to provide for stabilizing the integrators during the reset operation. The even numbered integrators may be any of the above described embodiments or conventional integrators.

FIG. 16 illustrates another third order delta-sigma modulator according to an embodiment. The example of FIG. 16 is that of a third order CIFB delta-sigma modulator. The embodiment of FIG. 16 is the same as the embodiment of FIG. 14 except for the addition of the third integrator 222 and the third power supply 262. Accordingly, only the difference between the embodiment of FIG. 16 and the embodiment of FIG. 14 will be described in detail. As shown in FIG. 16, the third integrator 222 receives that output of the second integrator 220, and the output of the third integrator 222 is supplied to the comparator 230. The third integrator 222 may be the same as the first integrator 210, and/or may be any of the above described embodiments. The third power supply 262 operates in the same manner as the first power supply 250 in supplying one of the first and second voltages V1 and V2 to the second node N2 of the third integrator 222 based on the output of the comparator 230. As will be appreciated, the third integrator 222 has the same sampling and integration phases as the first integrator 210.

Figure 17:
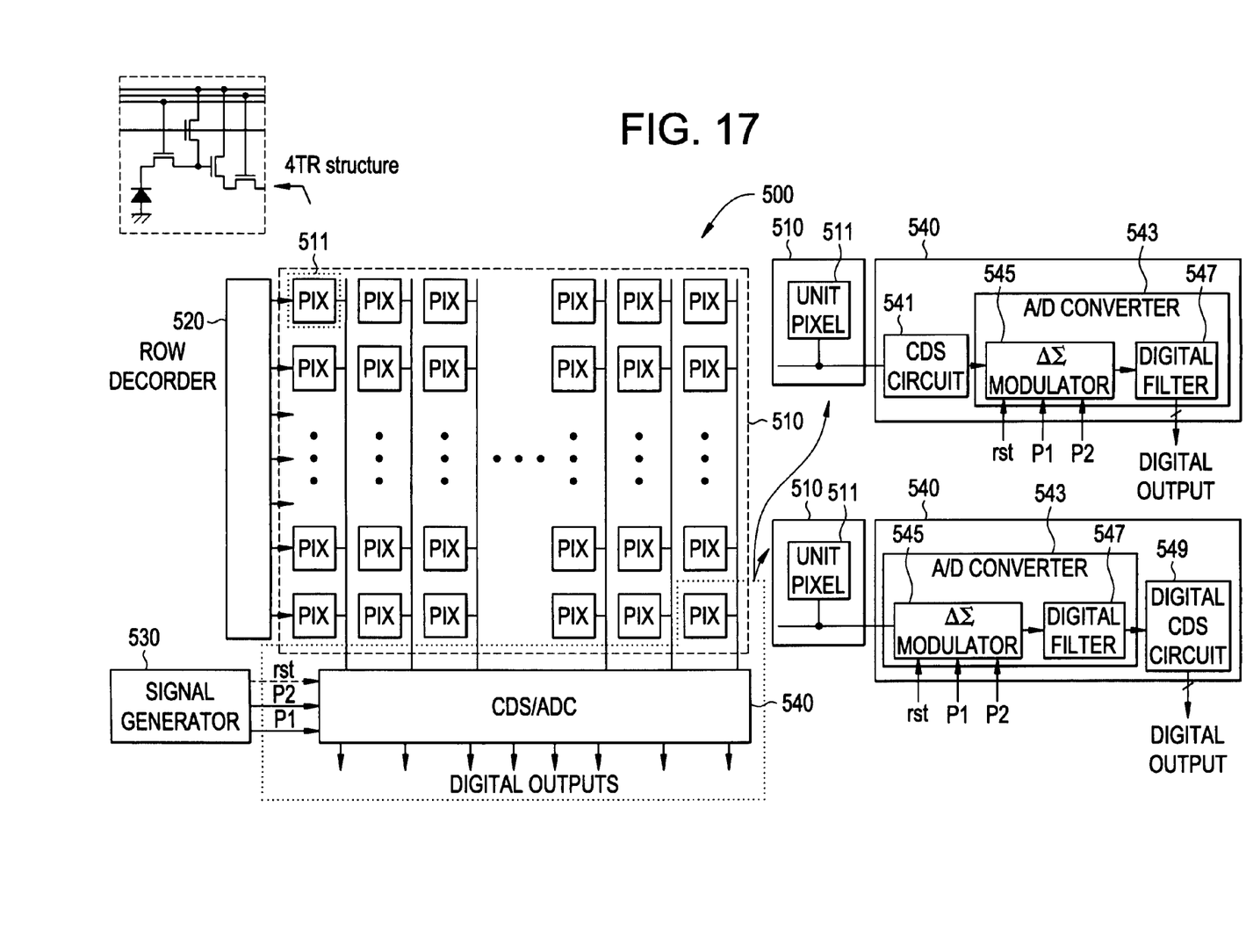
FIG. 17 illustrates an image sensor according to an embodiment.

FIG. 17 illustrates a C-MOS image sensor according to an embodiment. As shown, the C-MOS image sensor includes a pixel array 510. The pixel array 510 includes unit pixels 511 arranged in rows and columns. Each of the unit pixels 511 may have the well-known 4 transistor (4TR) structure shown in FIG. 17. A row decoder 520 selectively enables rows of unit pixels 511 to output. A correlated double sampling (CDS)/analog-to-digital converter (ADC) 540 receives the output from the unit pixels 511 in a selected row and generates digital outputs based thereon. In one embodiment, the CDS/ADC 540 includes a CDS circuit and an ADC circuit for each column of unit pixels 511. As shown in FIG. 17, in one embodiment a CDS circuit 541 will first process the output of a unit pixel 511 and the ADC circuit 543 may operate on the output of the CDS circuit 541. As alternatively shown in FIG. 17, instead the ADC circuit 543 may operate on the output of the unit pixel 511, and then a digital CDS circuit 549 may operate on the output of the ADC 543.

As further shown in FIG. 17, the ADC circuit 543 includes a delta-sigma modulator 545 and a digital filter 547, with the digital filter 547 filtering the output of the delta-sigma modulator 545. The delta-sigma modulator 545 may be any of the above described embodiments of a delta-sigma modulator. Alternatively, the delta-sigma modulator 545 may be any well known delta-sigma modulator with the integrator thereof replaced with one of the integrator embodiments described above.

A signal generator 530 supplies, first clock signal P1 and second clock signal P2 to the delta-sigma modulators 545 of the CDS/ADC 540. Optionally, the signal generator 530 may also supply a reset signal.

Figure 18:
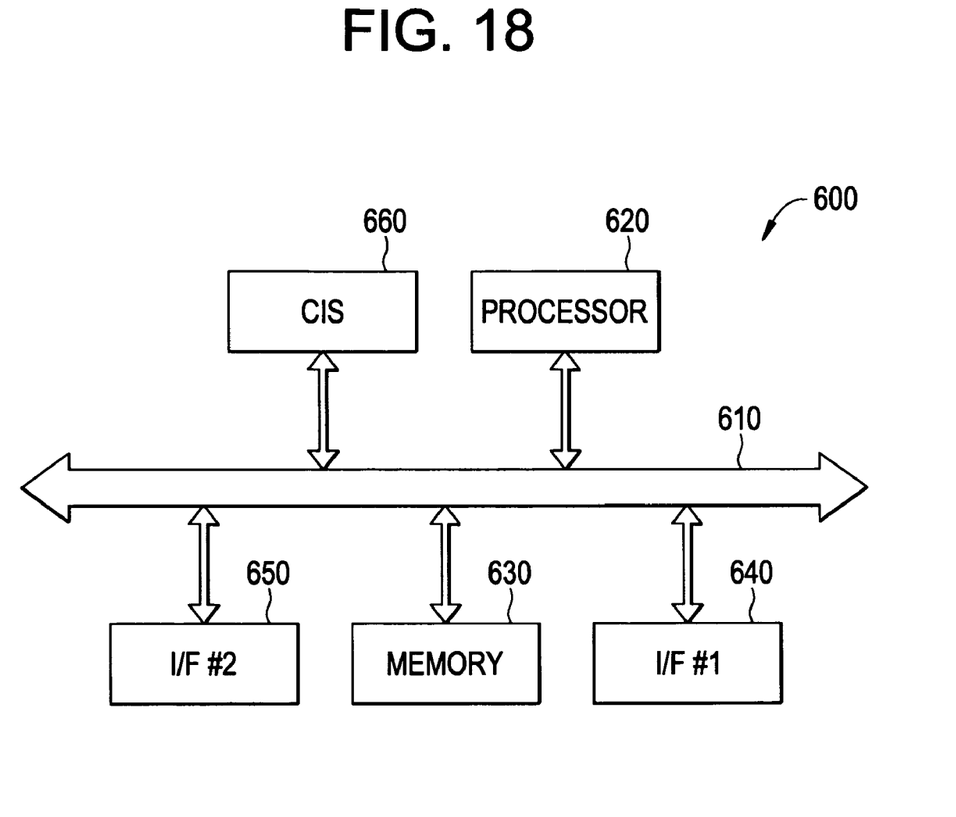
FIG. 18 illustrates an image processing system according to an embodiment.

FIG. 18 illustrates an image processing system according to an embodiment. As shown, a processor 620, a memory 630, a first interface 640, a second interface 650 and a C-MOS image sensor (CIS) 660 are connected to a common bus 610. The processor 620 controls the operation of the memory 630 and the CIS 660 based on input signals received from a user via the first and second interfaces 640 and 650. For example, the first and second interfaces 640 and 650 may be buttons, toggles, etc. forming part of the image processing system. The memory 630 may be any well-known type of memory such as optical disc, flash memory, hard drive, etc. The CIS 660 may be the CIS described with respect to FIG. 17. However, the CIS may be any well known CIS that incorporates a delta-sigma modulator according to an embodiment of the present invention. Still further the CIS 660 may be any well known CIS that incorporates a delta-sigma modulator having an integrator according to any of the embodiments of the present invention.

The invention being thus described, it will be obvious that the same may be varied in many ways. Such variations are not to be regarded as a departure from the invention, and all such modifications are intended to be included within the scope of the invention.

What is claimed is:

1. A modulator in an analog-to-digital converter, comprising:
   a first reset switch controlled by a reset signal, the first reset switch connected in a first reset feedback path between an input and an output of an integrator stage; and
   a second reset switch controlled by the reset signal, the second reset switch connected in a second reset feedback path between the input and the output of the integrator stage.

2. The modulator of claim 1, further comprising:
   first and second capacitors connected in series to the integrator stage, a first node being between the first and second capacitors, and a second node being between the second capacitor and the integrator stage.

3. The modulator of claim 2, further comprising:
   a first switch controlled by a first clock signal, the first switch connected between the first node and a reference voltage; and
   a third reset switch controlled by the reset signal, the third switch connected between the first node and the reference voltage.

4. The modulator of claim 3, further comprising:
   a second switch controlled by a second clock signal; the second switch connected between the first capacitor and the reference voltage, the first and second clock signals having non-overlapping pulses.

5. The modulator of claim 4, further comprising:
   a third switch controlled by the second clock signal, the third switch connected between the first node and a third node; and
   an inverse reset switch controlled by an inverse of the reset signal, the inverse reset switch connected between the first node and the third switch; and wherein
   the first reset switch is connected between the third node and the output of the integrator stage.

6. The modulator of claim 2, further comprising:
   a switch controlled by a clock signal, the switch connected between the first node and a third node; and
   an inverse reset switch controlled by an inverse of the reset signal, the inverse reset switch connected between the first node and the third switch; and wherein the first reset switch is connected between the third node and the output of the integrator stage.

7. The modulator of claim 1, wherein the integrator stage comprises:
   an inverter; and
   a capacitor connected between an input and an output of the inverter.

8. The modulator of 1, wherein the integrator stage comprises:
   an operational amplifier having positive and negative input terminals, the positive input terminal being connected to a reference voltage; and
   a capacitor connected between an output of the operational amplifier and the negative input terminal.

9. The modulator of claim 2, further comprising:
   a first switch controlled by a first clock signal, the first switch connected between the second node and a third node;
   a second switch controlled by a second clock signal, the second switch connected between the first node and the third node, the first and second clock signals having non-overlapping pulses; and wherein
   the first reset switch is connected between the third node and the output of the integrator stage; and the second reset switch is connected between the second node and the third node.

10. The modulator of claim 9, further comprising:
an inverse reset switch controlled by an inverse of the reset signal, the inverse reset switch connected between the first node and the second switch.

11. The modulator of claim 10, further comprising:
a third switch controlled by the first clock signal, the third switch connected between the first node and a reference voltage;
a third reset switch controlled by the reset signal, the third reset switch connected between the first node and the reference voltage.

12. The modulator of claim 11, further comprising:
a fourth switch controlled by the second clock signal; the fourth switch connected between the first capacitor and the reference voltage.

13. The modulator of claim 11, further comprising:
a third capacitor connected between the third node and the output of the integrator stage.

14. The modulator of claim 2, further comprising:
a first switch controlled by a first clock signal, the first switch connected between the second node and a third node;
a second switch controlled by a second clock signal, the second switch connected between the first node and the third node, the first and second clock signals having non-overlapping pulses; and wherein
the first reset switch is connected between the third node and the output of the integrator stage; and
the second reset switch is connected between the second node and the output of the integrator stage.

15. The modulator of claim 14, further comprising:
a third switch controlled by the first clock signal, the third switch connected between the first node and a reference voltage; and
a fourth switch controlled by the second clock signal; the fourth switch connected between the first capacitor and the reference voltage.

16. The modulator of claim 14, further comprising:
a third capacitor connected between the third node and the output of the integrator stage.

17. A modulator in an analog-to-digital converter, comprising:
at least first and second integrator stages connected in series, at least one of the first and second integrator stages including,
a first reset switch controlled by a reset signal, the first reset switch connected in a first reset feedback path between an input and an output of an integrator stage, and
a second reset switch controlled by the reset signal, the second reset switch connected in a second reset feedback path between the input and the output of the integrator stage;
a summer configured to sum output from the first and second integrator stages; and
a comparator configured compare output of the summer and a reference signal to generate an output.

18. The modulator of claim 17, further comprising:
a detection unit configured to generate the reset signal based on the output from the comparator.

19. The modulator of claim 17, further comprising:
a power supply configured to selectively supply different voltages to the first integrator stage based on the output from the comparator.

20. A modulator in an analog-to-digital converter, comprising:
at least first and second integrator stages connected in series, at least one of the first and second integrator stages including,
a first reset switch controlled by a reset signal, the first reset switch connected in a first reset feedback path between an input and an output of an integrator stage, and
a second reset switch controlled by the reset signal, the second reset switch connected in a second reset feedback path between the input and the output of the integrator stage; and
a comparator configured compare output of a last integrator stage and a reference signal to generate an output.

21. The modulator of claim 20, further comprising:
a detection unit configured to generate the reset signal based on the output from the comparator.

22. The modulator of claim 20, further comprising:
a power supply associated with each of the at least first and second integrator stages, each power supply configured to selectively supply different voltages to the associated integrator stage based on the output from the comparator.

23. An analog-to-digital converter, comprising:
a modulator, the modulator including,
a first reset switch controlled by a reset signal, the first reset switch connected in a first reset feedback path between an input and an output of an integrator stage, and
a second reset switch controlled by the reset signal, the second reset switch connected in a second reset feedback path between the input and the output of the integrator stage; and
a digital filter filtering output of the modulator.

24. An image sensor, comprising:
a pixel unit array;
a row decoder configured to selectively enabling output of a row of pixel units in the pixel unit array;
a processing circuit configured to process output from each pixel unit in the enabled row of pixel units, the processing circuit including,
an analog-to-digital converter (ADC), the ADC including,
a modulator, the modulator including,
a first reset switch controlled by a reset signal, the first reset switch connected in a first reset feedback path between an input and an output of an integrator stage, and
a second reset switch controlled by the reset signal, the second reset switch connected in a second reset feedback path between the input and the output of the integrator stage; and
a digital filter filtering output of the modulator.

25. The image sensor of claim 24, wherein the processing circuit comprises:
a correlated double sample (CDS) circuit associated with each analog-to-digital converter, the CDS circuit configured to perform a CDS operation on output from a unit pixel, and supply output to the associated ADC.

26. The image sensor of claim 24, wherein the processing circuit comprises:
a correlated double sample (CDS) circuit associated with each analog-to-digital converter, the CDS circuit configured to perform a CDS operation on output from the associated ADC.

27. An image processing system, comprising:
a memory;
an image sensor;

at least one interface; and a processor, the processor configured to control at least one of the image sensor and the memory based on input from the interface; and wherein the image sensor includes, a pixel unit array;

a row decoder configured to selectively enabling output of a row of pixel units in the pixel unit array;

a processing circuit configured to process output from each pixel unit in the enabled row of pixel units, the processing circuit including, an analog-to-digital converter (ADC), the ADC including, a modulator, the modulator including, a first reset switch controlled by a reset signal, the first reset switch connected in a first reset feedback path between an input and an output of an integrator stage, and a second reset switch controlled by the reset signal, the second reset switch connected in a second reset feedback path between the input and the output of the integrator stage; and a digital filter filtering output of the modulator.

* * * * *